United States Patent
Ajuria et al.

[11] Patent Number: 5,837,612
[45] Date of Patent: Nov. 17, 1998

[54] SILICON CHEMICAL MECHANICAL POLISH ETCH (CMP) STOP FOR REDUCED TRENCH FILL EROSION AND METHOD FOR FORMATION

[75] Inventors: Sergio Ajuria; Soolin Kao, both of Austin, Tex.

[73] Assignee: Motorola, Inc., Schaumburg, Ill.

[21] Appl. No.: 905,478

[22] Filed: Aug. 1, 1997

[51] Int. Cl.$^6$ .............................. H01L 21/44; H01L 21/48
[52] U.S. Cl. ....................... 438/697; 438/697; 438/424; 438/425; 438/426; 438/435; 438/437; 438/296; 438/221; 438/692; 148/DIG. 50
[58] Field of Search .................... 438/424, 425, 438/426, 435, 437, 296, 221, 697, 692; 148/DIG. 50

[56] References Cited

U.S. PATENT DOCUMENTS

| | | | |
|---|---|---|---|
| 5,190,889 | 3/1993 | Poon et al. | 438/437 |
| 5,229,316 | 7/1993 | Lee et al. | 438/424 |
| 5,340,769 | 8/1994 | Miyamoto | 438/296 |
| 5,387,540 | 2/1995 | Poon et al. | 438/437 |
| 5,455,194 | 10/1995 | Vasquez et al. | 438/425 |
| 5,506,168 | 4/1996 | Morita et al. | 438/424 |
| 5,578,518 | 11/1996 | Koike et al. | 438/424 |
| 5,604,159 | 2/1997 | Cooper et al. | 438/296 |
| 5,677,229 | 10/1997 | Morita et al. | 438/426 |
| 5,712,185 | 1/1998 | Tsai et al. | 438/692 |
| 5,766,823 | 6/1998 | Fumitomo | 438/221 |

OTHER PUBLICATIONS

K. Blumenstock, et al., "Shallow trench isolation for ultra–large–scale integratedevices", J. Vac. Scl. Technol, B, vol. 12, No. 1 Jan./Feb. 1994, pp. 54–58.

Primary Examiner—Charles Bowers
Assistant Examiner—Thanh Nguyen
Attorney, Agent, or Firm—Keith E. Witek; J. Gustav Larson

[57] ABSTRACT

A method for forming shallow trench isolation (STI) (100) begins by forming an oxidizable layer (106) preferably made of polysilicon. An opening is patterned and etched through this layer (106) to define and form the trench isolation region (108). Silicon sidewalls of the trench (108) and the polysilicon layer (106) are then exposed to an oxidizing ambient to form a thermal oxide trench liner (107a) and an erosion-protection polysilicon-oxide layer (107b). A trench fill material (110a) is then deposited and chemically mechanically polished (CMP) utilizing the polysilicon layer (106) as a polish stop. The final polished trench fill plug comprises an ozone TEOS bulk material (110c) and an annular peripheral upper erosion-protection portion formed of the polysilicon-oxide (107d). The annular polysilicon-oxide protection regions (107d) either reduce or entirely eliminate adverse sidewall parasitic erosion which occurs in conventional trench technology when processing active areas (124).

33 Claims, 5 Drawing Sheets

SILICON CHEMICAL MECHANICAL POLISH ETCH (CMP) STOP FOR REDUCED TRENCH FILL EROSION AND METHOD FOR FORMATION

FIELD OF THE INVENTION

The present invention relates generally to semiconductor manufacturing, and more particularly to, reducing trench fill erosion in shallow trench isolation (STI) processing.

BACKGROUND OF THE INVENTION

In the integrated circuit (IC) industry, trench isolation is now being used to replace conventional local oxidation of silicon (LOCOS) in order to form improved field isolation structures. However, the dielectric material used to fill isolation trenches formed within a substrate may be substantially eroded during post-trench processing whereby adverse parasitic MOSFET devices are formed adjacent the active areas of an integrated circuit (IC). FIGS. 1–5 illustrate the parasitic MOSFET formation which occurs in a conventional shallow trench isolation (STI) integrated circuit (IC) process.

Figure 1:
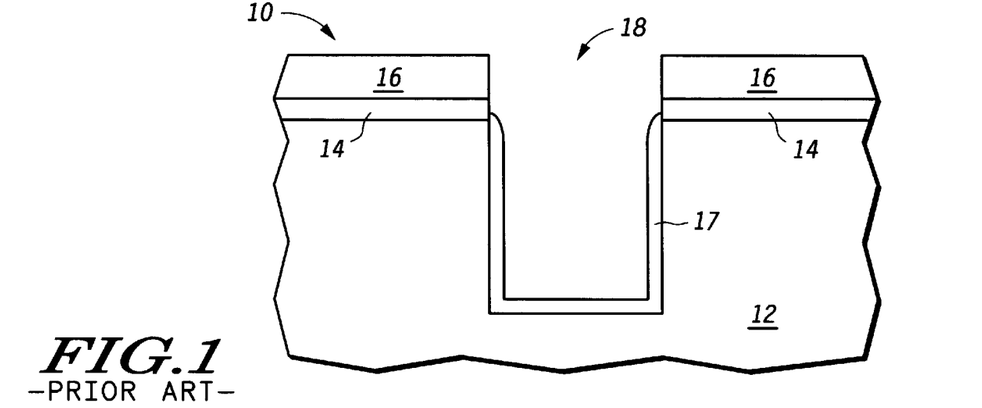
FIGS. 1–5 illustrate, in cross-sectional diagrams, a prior art trench fill process which results in substantial trench fill erosion which creates disadvantageous parasitic sidewall MOSFET devices.

FIG. 1 illustrates a semiconductor trench structure 10. In FIG. 1, a semiconductor substrate or semiconductor wafer 12 is provided. A pad oxide or thermal oxide layer 14 is formed over the substrate 12. A thicker silicon nitride layer 16 is deposited on top of the thin oxide layer 14. Conventional photolithographic processing is used to etch an opening 18 through the silicon nitride layer 16 and the oxide layer 14 to expose a portion of the substrate 12. This opening in the dielectric layers 14 and 16 is then extended into the substrate by a silicon etch to form a shallow trench region 18. After formation of the shallow trench region 18, a thermal oxidation process is utilized to form a thin oxide liner layer 17 on both the sidewalls and the bottom surface of the trench 18 in FIG. 1.

Figure 2:
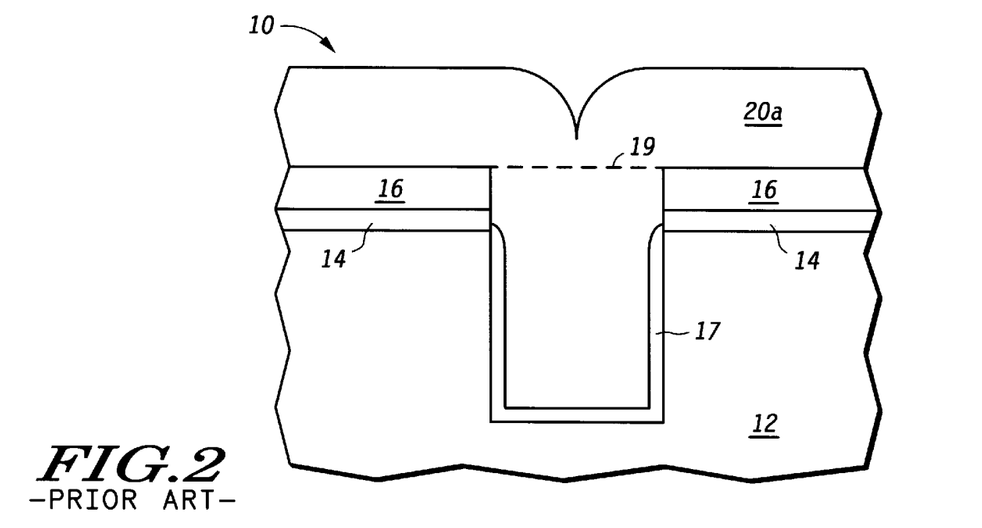

FIG. 2 illustrates that a trench fill layer 20a is conformally deposited within the trench 18 after formation of the liner 17. Layer 20a is typically formed of a tetraethylorthosilicate (TEOS) layer and is formed of a thickness much greater than the silicon nitride layer 16. FIG. 2 illustrates a dashed line 19 within the layer 20a. Line 19 indicates a level to which the layer 20a will be subsequently polished to form a proper trench fill plug region using the silicon nitride layer 16 as a polish stop layer.

Figure 3:
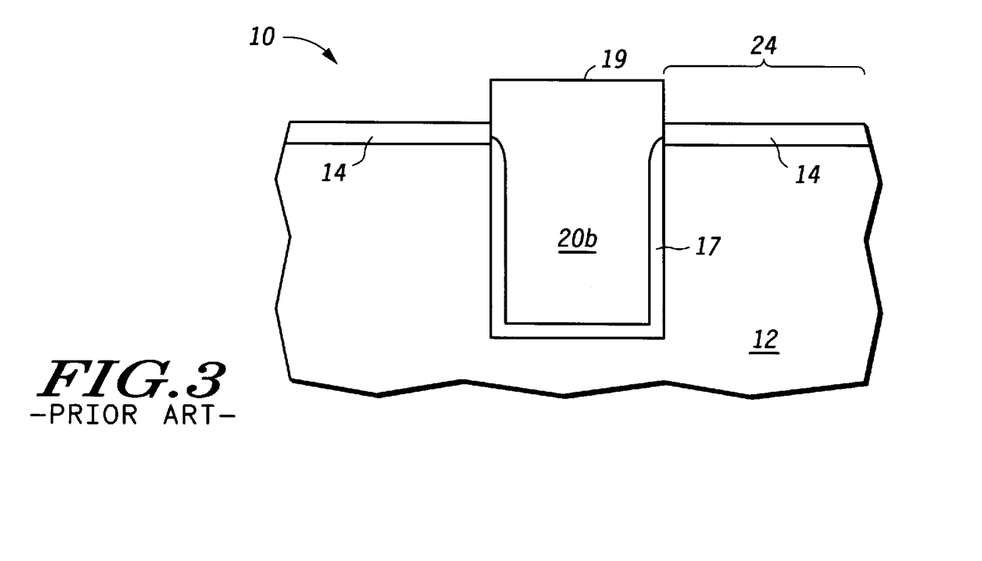

FIG. 3 illustrates the structure of FIG. 2 after chemical mechanical polishing (CMP) planarization of layer 20a of FIG. 2 has occurred. The CMP process forms a trench plug region 20b from the layer 20a illustrated previously in FIG. 2. As indicated in FIG. 3, a top surface 19 of the plug region 20b is roughly analogous to the dashed line 19 in FIG. 2. After chemical mechanical polishing (CMP) is complete, the silicon nitride layer 16, which is used as a chemical mechanical polish (CMP) stop, is then removed by a wet etch process. After removal of the silicon nitride layer 16, at least one active area, indicated as active area 24, is defined at top surface of the substrate 12 in FIG. 3. Electrical devices are subsequently formed within the active area 24 of the substrate and interconnected by overlying conductive layer to form a functional IC.

Figure 4:
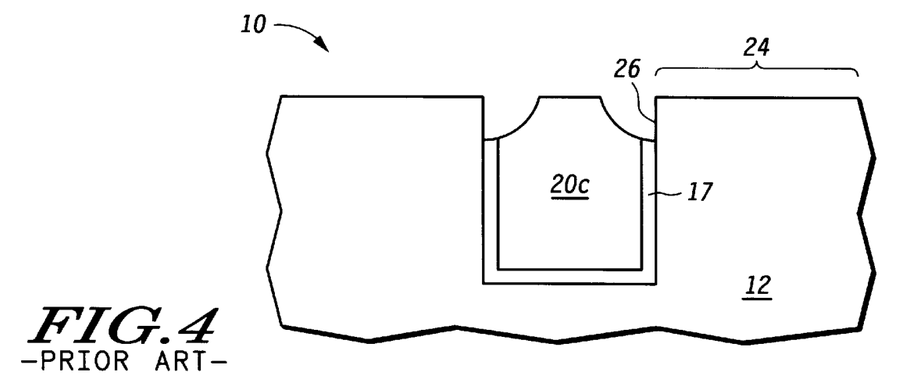

FIG. 4 illustrates the adverse erosion of the trench fill plug 20b which occurs from subsequent processing of the active area 24. After formation of the trench plug 20b in FIG. 3, the active area 24 is exposed to many etch processing steps and cleaning steps which will eventually erode the dielectric plug material 20b over time. It is known in the art that TEOS layers will etch in oxide etch environments faster than thermally grown oxide layers. This faster etch rate of TEOS when compared to thermal oxide (e.g., gate oxides and most sacrificial oxides) will further exacerbate the erosion of the plug region 20b compared to other IC regions since the trench plug 20b is typically made of TEOS. FIG. 4 illustrates a plug region 20c which is the plug region 20b (see FIG. 3) after being substantially eroded by subsequent semiconductor processing that is needed to make active circuitry in the region 24. As illustrated in FIG. 4, erosion of the plug to result in an eroded plug 20c forms an exposed sidewall 26 of the active silicon surface area 24. This sidewall area 26 is exposed to subsequent active area processing (e.g., gate oxide and gate polysilicon formation) whereby unwanted parasitic sidewall devices (e.g., an unwanted sidewall parasitic MOSFET) are formed on the sidewall 26 of the active area 24.

Figure 5:
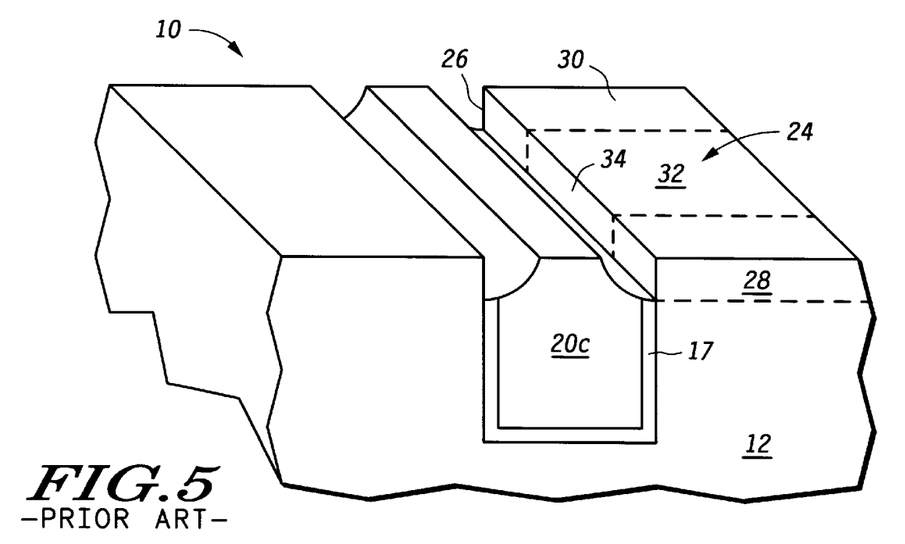

FIG. 5 illustrates a three-dimensional cross-sectional perspective of the device of FIG. 4. FIG. 5 illustrates the top surface of the active area 24 of FIG. 4 as well as the parasitic sidewall 26 which is adversely formed by trench plug erosion. FIG. 5 illustrates that a MOSFET source region 28 and a MOSFET drain region 30 are formed within the active area by conventional ion implantation and thermal activation. These source and drain region 28 and 30 are separated by a channel region 32 within the active area 24. As is known in the art, a gate dielectric layer (not specifically shown in FIG. 5) is formed over the channel region 32 and a conductive gate electrode (not specifically shown in FIG. 5) is then formed overlying this gate oxide and overlying the channel region 32. The gate electrode is used to control a conductivity of the channel region 32 between the current electrode regions 28 and 30 in FIG. 5.

Unfortunately, due to the erosion present in the trench plug region 20c, a parasitic MOSFET sidewall channel region 34 is present in the structure of FIG. 5 once the gate electrode is formed. Due to the fact that parasitic channel region 34 will be exposed to gate oxide formation and lie adjacent a portion of a subsequently formed gate electrode, the channel region 34 is a parasitic transistor channel region which is formed between the electrodes 28 and 30 in parallel to the desired channel region 32. Due to the fact that threshold (Vt) adjust implants, well region doping profiles, and other implanted regions are formed in the substrate, doping concentrations of dopant atoms in the substrate is not constant throughout the depth of a semiconductor substrate 12. Therefore, the threshold voltage of the vertical sidewall 34 may be substantially different from a threshold voltage of the top channel region 32 which will have a substantially constant dopant across its surface due to the fact that it in not directed into the depth of the substrate as is channel region 34. Typically, a doping concentration of the region 34 integrated over the vertical sidewall will be less or more than a doping concentration at the active area surface 32. Therefore, the parasitic channel region 34 is likely to typically "turn on" and form a conductive inversion region (i.e., an unwanted parasitic leakage path) between the regions 28 and 30 before the actual transistor channel region 32 is "turned-on" creating undesirable MOSFET behavior. If the sidewall of the channel region 34 of FIG. 5 is deep, the likelihood of forming adverse polysilicon stringers when patterning polysilicon gate electrodes also increases. Therefore, this parasitic channel region 34 is disadvantageous altogether.

One way to reduce the adverse erosion of the trench region 20c as illustrated in FIG. 5 is to expose the trench region 20c to fewer etch environments. The prior art has attempted to reduce the amount of wet etching and reactive ion etching (RIE) of the trench fill material 20c by reducing the amount of processing in the active area 24. However, for each etch and/or clean process removed from the overall semiconductor flow, the active area 24 is not being fully or adequately processed in accordance with general IC processing standards. As a result, integrated circuit (IC) yield in the active area and/or IC performance may be adversely impacted due to reduced cleaning processing and reduced etch processing.

Another solution attempted in the prior art is to form the liner 17 of FIG. 1 from a silicon nitride layer or a silicon oxynitride layer. This silicon nitride liner 17 will not etch substantially in oxide/TEOS etch environments and will not etch substantially in substrate cleaning processes. Therefore, through use of this nitrided liner, the sidewall erosion of the trench fill material 20c should be reduced by the sidewall presence of silicon nitride or oxynitride 17. However, silicon nitride (in contact with a Si substrate) has been shown to cause stress induced defects near the active area which adversely impacts MOSFET devices. Furthermore, any deposition of additional material within the trench may change the aspect ratio of the trench opening 18 thereby adversely affecting subsequent deposition processing and trench filling.

In addition, the presence of both exposed oxide surfaces and exposed nitride surfaces when forming the trench layer 20a in FIG. 2 adversely affects the conformality and selectivity of the TEOS deposition process of FIG. 2. Also, silicon nitride and some nitrided oxides has a greater permittivity ($\epsilon$) or dielectric constant whereby the capacitive coupling to the parasitic sidewall region 34 may actually be increased by using a nitrided film thereby exacerbating the problems discussed herein. Nitride layers also reduce subsequent oxidation of any exposed sidewall wherein it may be impossible to advantageously thicken a parasitic gate dielectric laterally adjacent an exposed sidewall channel region 34 via thermal oxide growth or the like. Therefore, the increased complexity and risk from using a nitride or nitrided trench fill liner is not always advantageous.

In another embodiment, polysilicon may be deposited within the trench 18 formed in FIG. 1 whereby this polysilicon can be thermally oxidized to form a polysilicon-oxide liner 17 in the hope of reducing sidewall erosion of the region 20c. Note that polysilicon-oxide is similar to thermal oxide in that it etches slower than TEOS which could reduce overall trench erosion over time. However, this process adds at least one other process step to the process flow (e.g., it adds at least the additional step of the deposition of the polysilicon), and may decrease a lateral dimension of the trench whereby filling of the trench via subsequent dielectric deposition processing is more complicated.

Therefore, a need exists in the industry for a trench isolation process which reduces trench plug erosion of the plug 20c thereby eliminating or reducing the adverse device affects of the parasitic sidewall MOSFET channel region 34 of FIG. 5 without significantly complicating the process flow or changing trench dimensions.

BRIEF DESCRIPTION OF THE DRAWINGS

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DESCRIPTION OF A PREFERRED EMBODIMENT

Generally, the present invention is an improved process for forming shallow trench isolation (STI) with reduced integrated circuit (IC) trench fill erosion whereby parasitic sidewall MOSFETs in an active area of the integrated circuit (IC) can either be reduced in severity or entirely eliminated. This improvement is accomplished by replacing conventional silicon nitride chemical mechanical polish (CMP) stops (e.g., layer 16 of FIGS. 1–2) with a polysilicon polish stop 106. This polysilicon polish stop 106 is readily oxidized in an oxidation environment whereby an erosion-protective sidewall oxide 107d of the polysilicon layer is formed (see FIG. 11 herein). After final trench fill to form a trench plug 110c, this polysilicon-oxide sidewall 107d will remain behind as a part of the trench fill plug region. The edge-positioned polysilicon thermal oxide 107d will etch at a slower rate than the ozone TEOS layer 110c which is the bulk of the trench fill plug region 110c. This added etch resistance at the periphery of the trench fill plug region due to the presence of region 107d provides critical etch reduction along the sidewalls of the trench fill region 110c, where avoidance or reduction of the sidewall parasitic devices of FIG. 5 is achieved.

Figure 11:
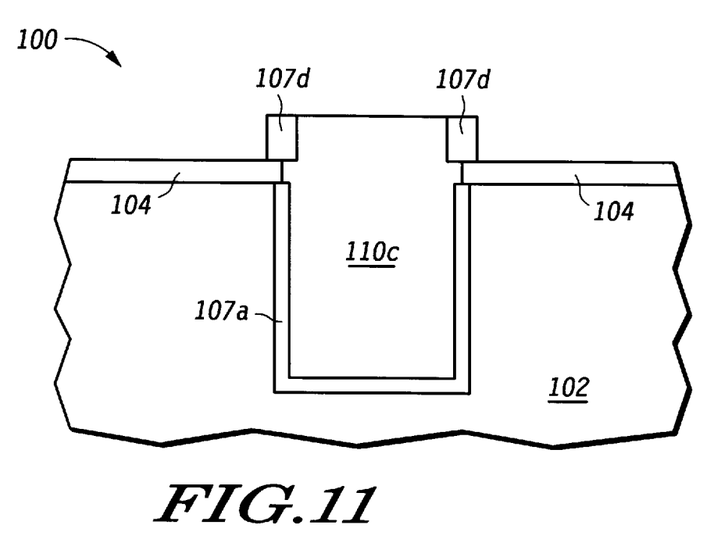

In summary, this additional protection 107d provided around the periphery of the trench plug 110c in FIG. 11 will reduce sidewall erosion of the trench plug during subsequent active area processing whereby parasitic sidewall MOSFET channel region 34 of FIG. 5 can either be reduced in severity or entirely eliminated from integrated circuits (ICs) without complicating a process flow.

The process taught herein has several advantages over the prior art of FIGS. 1–5. First, as previously discussed, the presence of the parasitic sidewall channel region 34 can either be reduced in severity or entirely eliminated from active areas of an IC whereby the operating characteristics of MOSFET devices formed laterally adjacent the trench regions 108 will be improved. In addition, by replacing the conventional nitride polish stop 16 of FIG. 1 with a polysilicon polish stop 106 herein, adverse and well known bird's beak effects can be reduced. This bird's beak reduction is accomplished since oxidation ambients prefer to form thermal oxide on the upper polysilicon surface as opposed to the underlying single crystalline silicon surfaces. This reduced bird's beak advantage is not present in the silicon nitride CMP stop trench embodiment of FIGS. 1–5. It is also important to note that the erosion protection mechanism present in the process taught herein is provided without adding any additional processing steps to the overall process flow. Therefore, the erosion advantages obtained herein may be gained without an impact to IC fabrication facility throughput, without added cost, and without reduction in IC yield.

Polysilicon oxidizes at a faster rate than single crystalline silicon. Specifically, an oxidation rate of polysilicon is enhanced by roughly 1.1x to 2.0x that of single crystalline Si depending upon phosphorus or arsenic doping concentrations of the polysilicon and single crystalline Si. Therefore, a thin Si-trench thermal liner can be obtained simultaneously with a thicker polysilicon-oxide erosion protection region. The thin Si-trench liner along with a thicker polysilicon-oxide protection region formed simultaneously provides improved trench erosion protection while maintaining the advantages of a thin trench liner. However, if the thickness of the polysilicon-oxide far exceeds that of the trench liner oxide it can form a bottle-shaped trench which is not desirable for subsequent trench fill processing. Therefore, the growth of the liner 107a along with the protection region 107b in FIG. 7 should be within a certain bounds that is a function of the width of the trench region.

Furthermore, during trench isolation operation taught herein in FIGS. 6–12, a homogeneous oxide surface is exposed to the ozone TEOS trench fill whereby the conformality and selectivity of subsequent ozone TEOS trench fill deposition will be improved over the prior art structure which may expose both oxide and silicon nitride surfaces to the trench fill ambient. Since there is virtually no narrowing of the trench using the process of FIGS. 6–12, the process taught herein is more scalable than the other solutions which are currently available.

It is not uncommon for portions of any polish stop layer to be left behind due to certain processing anomalies. Removal of residual remaining portions of the silicon nitride layer 16 from active areas in FIG. 5 is much more difficult (it may be impossible) than the oxidation and/or removal of any residual polysilicon etch stop layer regions which may result using the process taught herein. Also, since polysilicon can be easily oxidized and/or removed during subsequent active area processing, unlike the prior art silicon nitride polish stop, severe over-polishing does not need to be utilized in FIGS. 6–12 in order to render a fully function high-yield active area.

The invention can be further understood with specific reference to FIGS. 6–12.

Figure 6:
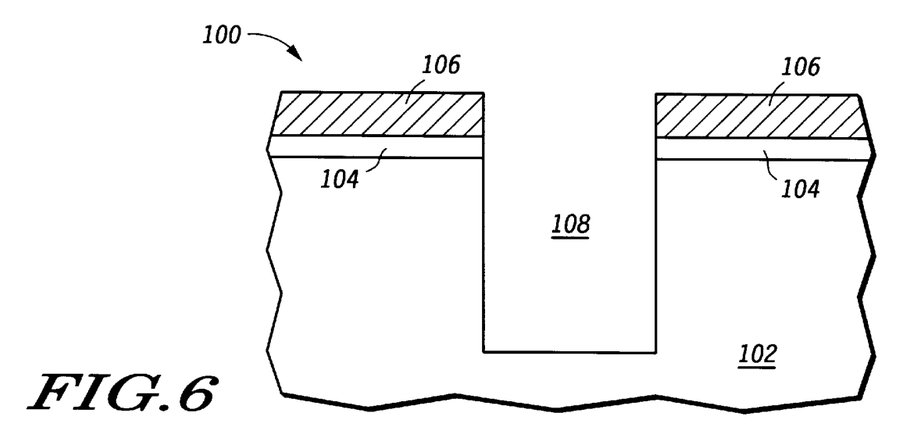
FIGS. 6–12 illustrate, in cross-sectional diagrams, an improved trench isolation process which reduces or eliminates adverse trench fill erosion in accordance with the present invention.

FIG. 6 illustrates a semiconductor trench structure 100. In FIG. 6, a semiconductor substrate 102 is provided. Typical semiconductor substrates 102 include silicon substrates, gallium arsenide substrates, germanium substrates, germanium silicon substrates, silicon on insulator (SOI) substrates, epitaxial formations, and the like. FIG. 6 illustrates that a dielectric layer 104 is formed on a top surface of the substrate 102. Preferably, layer 104 is a thermally grown oxide layer which is made of silicon dioxide. Typically, the layer 104 is formed having a thickness between 50 angstroms and 250 angstroms with a thickness of roughly 150 angstroms being preferred. An oxidizable layer 106 is then formed over a top of the blanket dielectric layer 104. In a preferred form, the oxidizable layer 106 is made of polysilicon. This polysilicon layer 106 is typically formed having a thickness of roughly 1000–2000 angstroms. It is important to note that the polysilicon layer 106 may be replaced with any oxidizable material which may include one or more of amorphous silicon, epitaxial silicon, germanium silicon, oxidizable composite layers, and the like.

After formation of the layers 104 and 106, a photoresist layer (not illustrated in FIG. 6) is formed over the top of layer 106. This photoresist layer (not specifically illustrated in FIG. 6) is exposed selectively to light through a mask and chemically developed to form an opening which exposes a portion of the layer 106. This exposed portion of the polysilicon layer 106 is etched to form an opening 108 through the layer 106 which exposes the layer 104. The etch chemistry is then switched from a polysilicon etch to an oxide etch to deepen the opening 108 through the layer 104 and to expose a top portion of the semiconductor substrate 102. The etch process is then switched to a silicon reactive ion etch (RIE) in order to directionally etch the silicon substrate vertically to form the shallow vertical trench 108 which is fully illustrated in FIG. 6. It is important to note that the opening 108 forms an oxidizable sidewall of the polysilicon layer 106, an oxide sidewall of the layer 104, and a single-crystalline silicon substrate sidewall of the substrate 102. In addition, the trench 108 forms a single-crystalline bottom surface of the trench 108. Typically, the trench 108 is formed between 3,000–7,000 angstroms deep into the substrate 102 to provide adequate lateral MOS device isolation. After formation of the trench 108, the photoresist layer (not illustrated specifically in FIG. 6) is removed by an oxygen ash process or a like removal process.

Figure 7:
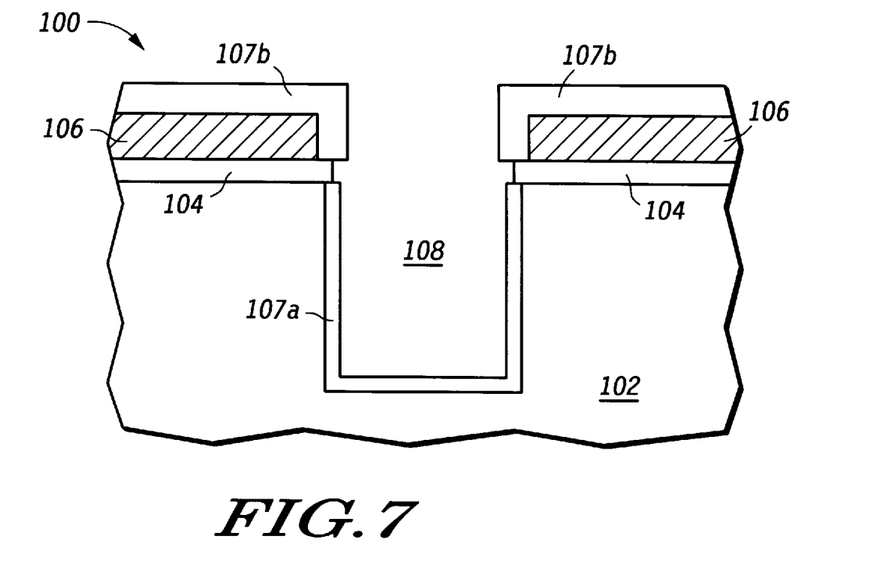

FIG. 7 illustrates that the trench 108 and the polysilicon 106 are exposed to an oxidizing ambient. This oxidizing ambient results in the formation of a thermal oxide liner 107a adjacent the sidewalls of the silicon substrate 102 and the bottom of the silicon substrate 102 within the trench 108. The same oxidation ambient results in a polysilicon-oxide being formed along an oxidizable sidewall of the layer 106 and a top surface of the layer 106. It is important to note that polysilicon will oxidize at a more rapid rate than single crystalline silicon depending upon polysilicon doping concentrations. Therefore, the thickness of the layer 107b, which is a polysilicon-oxide formed on top and on the sidewall of the polysilicon layer 106, will be thicker than the thermal oxide 107a, which is formed from the single crystalline silicon substrate 102. In a preferred form, the liner 107a is typically formed to a thickness of roughly 400 angstroms while the layer 107b is typically formed to a thickness of roughly 500–800 angstroms.

Figure 8:
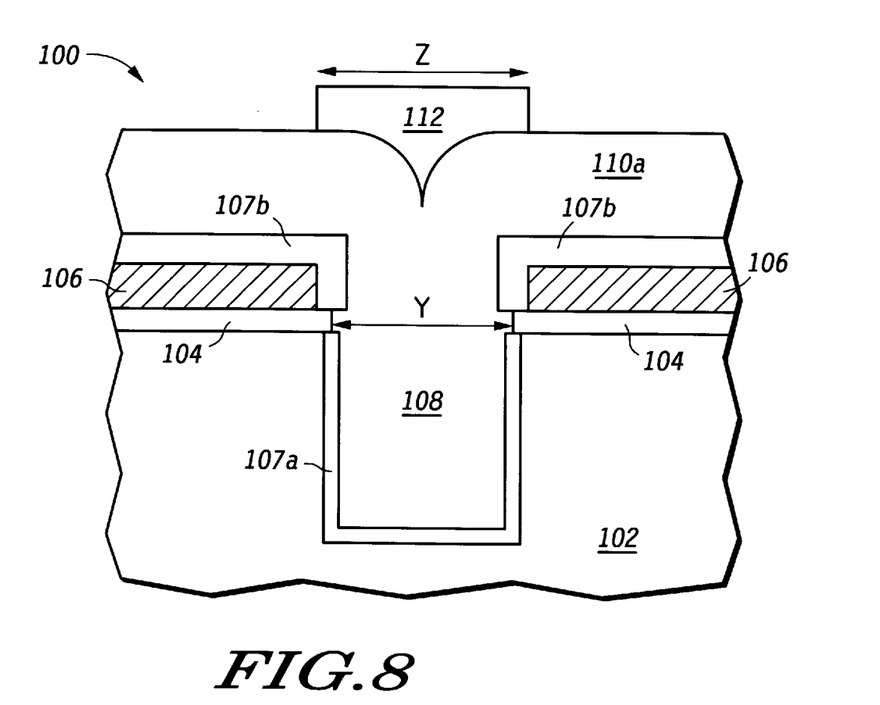

FIG. 8 illustrates that a trench fill layer 110a is formed over the layer 107b and adjacent to the layer 107a within the trench 108. In a preferred form, the trench fill layer is an ozone TEOS material or a composite-fill containing some ozone TEOS. In other forms, layer 110a may be replaced with other dielectric materials and/or composite dielectric layers such as a furnace TEOS or high density plasma (HDP) oxide. In a preferred form, the trench fill layer is typically deposited to a thickness of roughly 3,000–8,000 angstroms. FIG. 8 illustrates that a reverse trench mask 112 is formed overlying the trench region 108. Typically, the layer 112 is a photoresist material which has a horizontal photolithographically-defined width Z which is greater than the horizontal photolithographically-defined width Y of the trench 108. The TEOS ozone trench fill layer 110a may be optionally densified by a thermal densification process.

Figure 9:
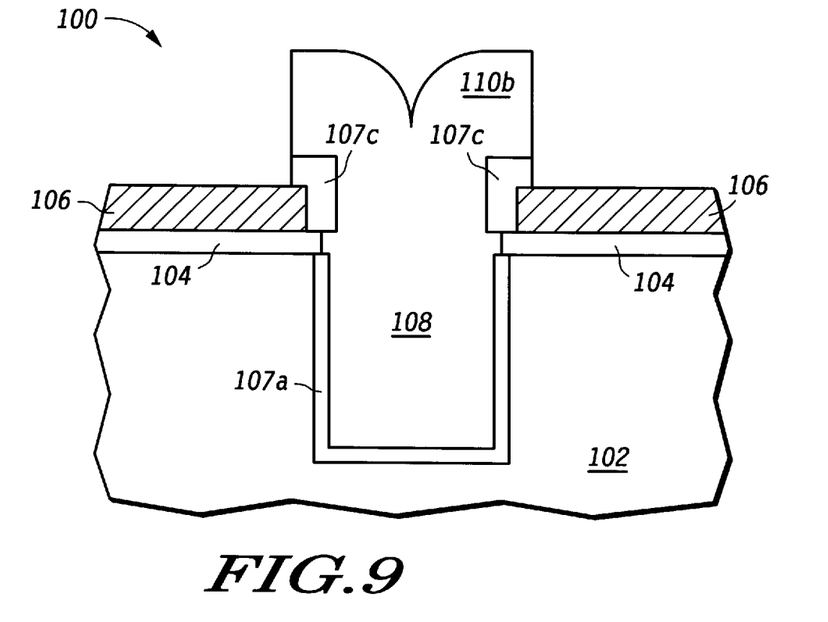

FIG. 9 illustrates that an oxide etch process is used to remove a substantial portion of the trench layer 110a to result in a trench plug formation 110b. The trench formation 110b is preferably formed from reactive ion etching (RIE) using $CHF_3$ and/or $CF_4$ in the presence of the mask layer 112 previously illustrated in FIG. 8. After this etching is performed to form the plug region 110b, the mask layer 112 is removed from the structure 100. It is important to note that the same plasma chemistry which is used to etch the layer 110a will also etch the polysilicon-oxide 107b along top surfaces of the polysilicon layer 106. The oxide etch will occur selective to the polysilicon 106 whereby the polysilicon-oxide layer 107b will be etched to form a peripheral ring 107c of polysilicon-oxide material around the active areas in FIG. 9 and around the a top periphery of the trench region 108. Note that oxide-to-polysilicon etch selectivity is typically higher than the oxide-to-nitride selectivity employed by the prior art.

Figure 10:
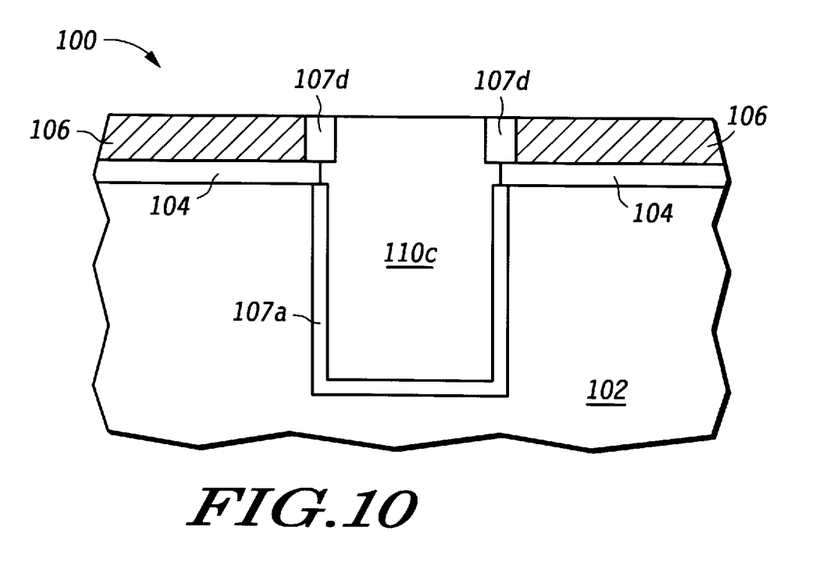

FIG. 10 illustrates that a chemical mechanical polishing (CMP) process is used to remove a top portion of the plug region 110b to result in a trench plug region 110c. As illustrated in FIG. 10, an upper peripheral portion of the trench fill material 110c is formed of the polysilicon-oxide material 107d while a bulk of the trench fill material is comprised of the ozone TEOS previously deposited and etched in FIGS. 8–9. The chemical mechanical polishing (CMP) process of FIG. 10 utilizes the polysilicon layer 106 as a polish stop layer.

FIG. 11 illustrates that the polysilicon polish stop layer 106 is removed, preferably by a dry etch with a oxide breakup step in the event that residual oxide is left over the polysilicon polish stop layer 106 after polish. Removal of the polysilicon layer 106 results in the formation of a trench plug comprising of the ozone TEOS portion 110c with a top peripheral polysilicon-oxide erosion-protection portion 107d. Since the polysilicon-oxide portion 107d etches at a slower rate than the bulk ozone TEOS in the central portions of region 110c, the peripheral ring 107d provides protection to the trench plug region whereby sidewall erosion illustrated in FIG. 5 is reduced to acceptable levels.

Figure 12:
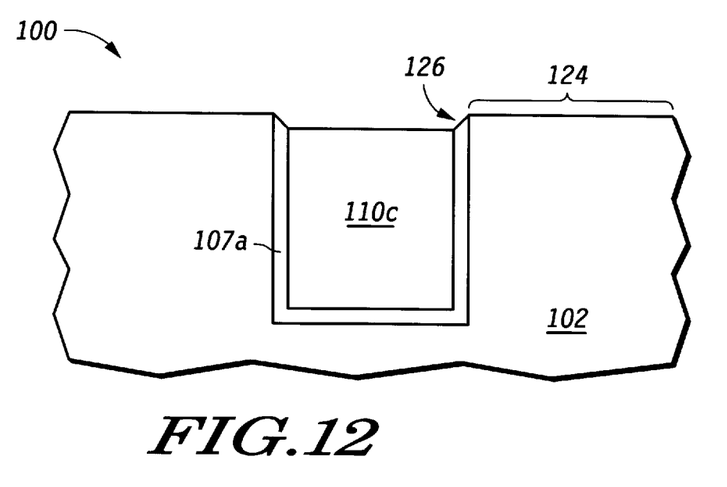

FIG. 12 illustrates that the plug region 110c delineates at least one active area 124. This active area 124 is then processed using various cleaning processing, etch processing, deposition techniques, and/or thermal oxidation to result in active MOS devices or like electrical devices within the active area 124. This same processing will affect upper portions of the plug region 110c as well as the layers 107d in FIG. 12. However, the presence of the layer 107d will protect the upper sidewall portions of the trench plug region by suppressing oxide etching in this area unlike that illustrated herein in prior art FIGS. 4–5. Therefore, a parasitic sidewall portion 126 of the structure of FIG. 12 will either be substantially reduced or entirely eliminated contrary to that illustrated in the prior art structure in FIGS. 4–5 which contains a substantial parasitic sidewall 26. Therefore, the structure of FIG. 12 will either entirely eliminate the parasitic channel region 34 of FIG. 5 or will significantly reduce the adverse effects of the parasitic region 34 due to the protective annular regions 107d without adding steps which complicate an overall process flow.

Although the invention has been described and illustrated with reference to specific embodiments, it is not intended that the invention be limited to those illustrative embodiments. Those skilled in the art will recognize that modifications and variations may be made without departing from the spirit and scope of the invention. For example, one may use a dual-etch process to remove the polysilicon layer 106. A first portion of the etch being an oxide break-up etch which ensures that all oxide over the polysilicon layer 106 is removed. This first portion of the etch is very selective to the polysilicon layer 106. The second portion of the etch is a silicon etch which is selective to oxide and substantially removes the polysilicon layer 106. The etching of FIG. 9 need not be performed before polishing in FIG. 10. Region 107d may be optionally nitrided for form a polyoxynitride which will further reduce sidewall erosion. As another example, region 106d can be comprised of thermal oxide and a portion of the adjacent oxidizable layer 106 by the use of underpolishing or additional masking steps. Therefore, it is intended that this invention encompass all of the variations and modifications as fall within the scope of the appended claims.

What is claimed is:

1. A method for forming a semiconductor structure, the method comprising the steps of:
    providing a semiconductor substrate;
    depositing an oxidizable layer over the semiconductor substrate;
    patterning the oxidizable layer to form an opening in the oxidizable layer, wherein the oxidizable layer has a sidewall portion and a top portion;
    oxidizing an exposed portion of the oxidizable layer to form an oxidized top portion and an oxidized sidewall portion of the oxidizable layer;
    filling the opening with a fill material;
    removing the oxidized top portion of the oxidizable layer and the oxidizable layer, wherein the fill material and at least a portion of the oxidized sidewall portion remain to form a trench plug region; and
    exposing the semiconductor structure to a removal environment.

2. The method of claim 1, where in the step of depositing an oxidizable layer further comprises:
    depositing a silicon-containing material as the oxidizable layer.

3. The method of claim 2, where in the step of depositing an oxidizable layer further comprises:
    depositing polysilicon as the oxidizable layer.

4. The method of claim 2, where in the step of depositing an oxidizable layer further comprises:
    depositing amorphous silicon as the oxidizable layer.

5. The method of claim 1, wherein the step of filling further comprises:
    filling the opening with a oxide dielectric material as the fill material.

6. The method of claim 5, wherein the step of filling further comprises:
    filling the opening with an ozone TEOS as the dielectric material.

7. The method of claim 5, wherein the step of filling further comprises:
    filling the opening with a composite dielectric as the dielectric material.

8. The method of claim 1, wherein the step of removing comprises the substeps of:
    polishing away at least some portions of the oxidized top portion; and
    etching away the oxidizable layer to expose active areas for subsequent processing steps.

9. The method of claim 1, further comprising the step of:
    exposing the trench plug region to an etch environment wherein the oxidizable sidewall portion etches at a slower rate than the fill material.

10. The method of claim 1, wherein the step of oxidizing further comprises the substep of:
    introducing nitrogen during at least a portion of the oxidizing step to form an oxynitride layer as both the oxidized top portion and the oxidized sidewall portion of the oxidizable layer.

11. The method of claim 1, further comprising a step of:
    forming an oxide layer between the oxidizable layer and the semiconductor substrate.

12. The method of claim 1, wherein the step of oxidizing further comprises the substep of:
    forming the oxidized top portion and the oxidized sidewall portion as a thermally-grown polysilicon dioxide region.

13. The method of claim 1, wherein the step of oxidizing further comprises the substep of:

forming a thermal silicon dioxide layer on a trenched portion of the semiconductor substrate which underlies the opening in the oxidizable layer wherein the thermal silicon dioxide layer is thinner than the oxidized sidewall portion of the oxidizable layer.

14. A method for forming a semiconductor structure, the method comprising the steps of:

providing a semiconductor substrate;

forming a dielectric layer over the semiconductor substrate;

forming an oxidizable layer over the dielectric layer;

forming an opening through the oxidizable layer, through the dielectric layer, and into the semiconductor substrate, the opening defining a oxidizable sidewall portion of the oxidizable layer, a dielectric sidewall portion of the dielectric layer, and a semiconductor substrate sidewall portion of the semiconductor substrate;

forming an oxide on the oxidizable sidewall portion of the oxidizable layer to form a first oxidized sidewall on the oxidizable layer and forming an oxide on the semiconductor substrate sidewall portion of the semiconductor substrate to form a second oxidized sidewall;

forming a fill layer over the opening;

planarizing to expose a top portion of the oxidizable layer;

removing the oxidizable layer, wherein the first oxidized sidewall remains along with a portion of the fill layer to create a trench plug region; and exposing the semiconductor structure to a removal environment.

15. The method of claim 14, wherein the step of forming the opening further comprises:

forming, as the opening, an isolation trench which separates two active regions of the semiconductor substrate.

16. The method of claim 14, wherein the step of forming the oxide further comprises:

forming the first oxidized sidewall to have a first thickness and the second oxidized sidewall to have a second thickness, wherein the first thickness is greater than the second thickness.

17. The method of claim 14, wherein the step of forming the oxide further comprises forming the first oxidized sidewall and the second oxidized sidewall simultaneously in time from a same growth ambient.

18. The method of claim 14, wherein the step of forming the oxide further comprises:

forming the first oxidized sidewall to have a first thickness and the second oxidized sidewall to have a second thickness, wherein the first thickness is approximately double the second thickness.

19. The method of claim 14, wherein the step of forming the oxide further comprises:

forming substantially no oxide on the dielectric sidewall portion.

20. The method of claim 14, wherein the step of forming a fill layer further comprises:

forming the fill layer with deposited TEOS.

21. The method of claim 14, wherein the step of forming a fill layer further comprises:

forming the fill layer with ozone-TEOS as the TEOS.

22. The method of claim 14, wherein:

the step of forming an oxide further comprises forming the first oxide where the first oxide has an inner sidewall edge adjacent to the opening and an outer sidewall edge adjacent to the oxidizable layer; and the step of removing the oxidizable layer comprises removing the oxidizable layer wherein the outer sidewall edge is exposed to an ambient and the inner sidewall edge is adjacent to a portion of the fill layer which remains as part of the trench plug region.

23. The method of claim 14, wherein the step of forming an oxide further comprises the substeps of:

introducing nitrogen during at least a portion of the oxidizing step to form an oxynitride layer as both the first and second oxidized sidewall.

24. The method of claim 14, wherein the step of forming an oxide further comprises the substeps of:

introducing nitrogen in a nitrous oxide or nitric oxide form during growth of the first and second oxidized sidewall.

25. The method of claim 14, further comprising the steps of:

exposing active areas, adjacent to the trench plug region, to etch environments which erode the trench plug region, the first oxidized sidewall eroding at a slower rate than the portion of the fill layer whereby trench erosion adjacent a sidewall of the active areas is reduced via the presence of the first oxidized sidewall.

26. The method of claim 14, wherein the step of planarizing further comprises:

planarizing by chemical mechanical polishing down to the top portion of the oxidizable layer by using the oxidizable material as a polish stop material.

27. The method of claim 14, wherein the step of forming an oxidizable layer comprises:

forming the oxidizable layer as a layer of polysilicon wherein the first oxidized sidewall is a polysilicon-oxide region.

28. A method for forming a semiconductor structure, the method comprising the steps of:

providing a semiconductor substrate;

forming a dielectric layer over the semiconductor substrate;

depositing a silicon-containing layer over the dielectric layer, the silicon-containing layer being semiconductive;

forming an isolation trench through the silicon-containing layer, the dielectric layer, and the semiconductor substrate, wherein the isolation trench includes a silicon-containing sidewall portion, a dielectric sidewall portion, and a semiconductor substrate sidewall portion;

forming an oxide on the silicon-containing sidewall portion to form a first oxidized sidewall and forming an oxide on the semiconductor substrate sidewall portion to form a second oxidized sidewall;

depositing a dielectric fill layer over the isolation trench;

densifying the dielectric fill layer;

patterning a reverse masked region above the isolation trench to form exposed portions of the dielectric fill layer;

etching the exposed portions of the dielectric fill layer using the silicon-containing layer as an etch stop;

removing the reverse masked region;

chemical mechanical polishing to form a planarized surface using the silicon-containing layer as a polish stop;

etching the silicon-containing layer whereby a portion of the dielectric fill layer and a portion of the first oxidized sidewall remain behind to form a trench isolation plug; and processing an active area of the semiconductor substrate to erode the first oxidized sidewall at a slower rate than the dielectric fill layer in the isolation trench wherein the first oxidized sidewall prevents substantial exposure of a sidewall of the active area.

29. The method of claim 28, wherein the step of forming the oxide further comprises:

forming an oxide layer; and introducing a nitrogen containing species to form an oxynitride layer.

30. The method of claim 28, wherein the step of introducing the nitrogen further comprises:

introducing nitric oxide or nitrous oxide as the nitrogen containing species.

31. The method of claim 28, wherein the step of depositing the silicon-containing layer further comprises:

depositing a doped silicon-containing layer.

32. The method of claim 28, wherein the step of depositing the silicon-containing layer further comprises:

depositing an undoped silicon-containing layer.

33. The method of claim 28, wherein the step of etching the silicon-containing layer further comprises:

performing an oxide break-up etch to remove any remaining oxide overlying the silicon-containing layer; and switching etch chemistry to a silicon etching environment to substantially etch the silicon-containing layer.

* * * * *